United States Patent
Kraus

(10) Patent No.: US 11,906,753 B2
(45) Date of Patent: Feb. 20, 2024

(54) OPTICAL SYSTEM IN PARTICULAR FOR MICROLITHOGRAPHY

(71) Applicant: Carl Zeiss SMT GmbH, Oberkochen (DE)

(72) Inventor: Johannes Kraus, Theilheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 525 days.

(21) Appl. No.: 17/229,167

(22) Filed: Apr. 13, 2021

(65) Prior Publication Data

US 2021/0231965 A1 Jul. 29, 2021

Related U.S. Application Data

(63) Continuation of application No. PCT/EP2019/071886, filed on Aug. 14, 2019.

(30) Foreign Application Priority Data

Oct. 22, 2018 (DE) .......................... 102018218064.4

(51) Int. Cl.
*G02B 27/14* (2006.01)
*G02B 1/02* (2006.01)
*G03F 7/00* (2006.01)

(52) U.S. Cl.
CPC ............... *G02B 27/14* (2013.01); *G02B 1/02* (2013.01); *G03F 7/70025* (2013.01); *G03F 7/70566* (2013.01); *G03F 7/70958* (2013.01)

(58) Field of Classification Search
CPC .......... C30B 29/12; G02B 1/02; G02B 27/14; G02B 27/283; G02B 27/10–16; G03F 7/70025; G03F 7/70566; G03F 7/70958; G03F 7/70966

See application file for complete search history.

(56) References Cited

U.S. PATENT DOCUMENTS 6,389,045 B1 * 5/2002 Mann .................... H01S 3/0057
372/100
6,765,717 B2 * 7/2004 Allan ...................... C30B 29/12
359/350

(Continued)

FOREIGN PATENT DOCUMENTS

DE 20 2004 020 810 U1 2/2006
DE 10 2005 023 939 A1 11/2006

(Continued)

OTHER PUBLICATIONS

JPO-Office Action, with translation, for corresponding JP Appl No. 2021-521466, dated May 12, 2022.

(Continued)

*Primary Examiner* — Bao-Luan Q Le
(74) *Attorney, Agent, or Firm* — Fish & Richardson P.C.

(57) ABSTRACT

An optical system, in particular for microlithography, includes a beam splitter, which has at least one light entry surface. The beam splitter is arranged in the optical system so that the angles of incidence with respect to the surface normal which occur at the light entry surface during operation of the optical system lie in the range of 45°±5°. The beam splitter is produced in [110] the crystal cut.

20 Claims, 4 Drawing Sheets

(56) References Cited

U.S. PATENT DOCUMENTS

| | | | | |
|---|---|---|---|---|
| 6,775,063 B2* | 8/2004 | Shiraishi | ............ | G03F 7/70966 359/489.03 |
| 6,904,073 B2* | 6/2005 | Yager | ................ | H01S 3/08004 372/55 |
| 7,564,888 B2 | 7/2009 | Ershov et al. | | |
| 7,916,291 B2* | 3/2011 | Milster | ..................... | G01J 3/44 356/301 |
| 7,965,756 B2* | 6/2011 | Wakabayashi | ........... | G02B 1/02 372/55 |
| 8,165,181 B2* | 4/2012 | Nagai | ................ | H01S 3/10061 372/27 |
| 8,300,213 B2* | 10/2012 | Tanaka | ............... | G03F 7/70141 355/71 |
| 8,472,111 B2* | 6/2013 | Gelernt | ................. | G02B 21/16 359/368 |
| 8,503,499 B2* | 8/2013 | Nagai | ..................... | G02B 1/02 372/27 |
| 8,855,167 B2* | 10/2014 | Nagai | ..................... | H01S 3/034 372/99 |
| 8,908,735 B2 | 12/2014 | Ershov | | |
| 8,982,922 B2 | 3/2015 | Ye | | |
| 9,081,193 B2* | 7/2015 | Gelernt | ................. | G02B 21/16 |
| 9,835,495 B2* | 12/2017 | Moriya | ................ | G02B 5/3066 |
| 11,264,773 B2* | 3/2022 | Tei | ........................ | H01S 3/2251 |
| 2003/0011896 A1* | 1/2003 | Shiraishi | ............. | G03F 7/70966 359/726 |
| 2003/0067679 A1* | 4/2003 | Allan | ..................... | C30B 29/12 359/356 |
| 2003/0099047 A1 | 5/2003 | Hoffman et al. | | |
| 2003/0219056 A1* | 11/2003 | Yager | ................ | G03F 7/70041 372/57 |
| 2004/0227988 A1* | 11/2004 | Albert | ................ | G03F 7/70966 359/364 |
| 2006/0171138 A1* | 8/2006 | Muramatsu | ......... | G03F 7/70566 362/23.18 |
| 2006/0289410 A1* | 12/2006 | Morita | ............... | B23K 26/0617 219/121.75 |
| 2009/0128796 A1* | 5/2009 | Tanaka | ................ | G03F 7/70141 355/71 |
| 2009/0168152 A1* | 7/2009 | Gelernt | ................. | G02B 21/16 359/385 |
| 2010/0053599 A1* | 3/2010 | Milster | ................. | G01J 3/0208 356/331 |
| 2010/0054297 A1* | 3/2010 | Wakabayashi | ........... | G02B 1/02 372/92 |
| 2010/0128747 A1* | 5/2010 | Nagai | .................. | H01S 3/2316 372/27 |
| 2011/0158281 A1* | 6/2011 | Nagai | ................. | G02B 5/3091 372/61 |
| 2012/0170021 A1* | 7/2012 | Walsh | ............... | G01N 21/8422 356/51 |
| 2012/0212830 A1 | 8/2012 | Mewes | | |
| 2013/0278922 A1* | 10/2013 | Gelernt | ................. | G02B 21/16 356/51 |
| 2013/0322483 A1* | 12/2013 | Nagai | ...................... | G02B 1/02 372/61 |
| 2016/0076944 A1* | 3/2016 | Moriya | .................... | G01J 11/00 359/485.02 |
| 2016/0126690 A1 | 5/2016 | Li | | |
| 2018/0364492 A1 | 12/2018 | Forcht | | |
| 2020/0067257 A1* | 2/2020 | Tei | ........................ | H01S 3/0346 |

FOREIGN PATENT DOCUMENTS

| | | |
|---|---|---|
| DE | 102012213553 A1 | 8/2013 |
| EP | 2 036 170 B1 | 8/2013 |
| JP | 200343223 A | 2/2003 |
| JP | 2009169431 A | 7/2009 |
| JP | 201050299 A | 3/2010 |

OTHER PUBLICATIONS

GPTO-Office Action, with translation thereof, for corresponding Appl No. DE 10 2018 218 064.4 dated Jun. 6, 2019.

International Search Report, with translation, for corresponding PCT Appl No. PCT/EP2019/071886, dated Jan. 7, 2020.

IPRP, with translation thereof, for corresponding Appl No. PCT/EP2019/071886 dated Apr. 27, 2021.

* cited by examiner

OPTICAL SYSTEM IN PARTICULAR FOR MICROLITHOGRAPHY

CROSS-REFERENCE TO RELATED APPLICATIONS

The present application is a continuation of, and claims benefit under 35 USC 120 to, international application PCT/EP2019/071886, filed Aug. 14, 2019, which claims benefit under 35 USC 119 of German Application No. 10 2018 218 064.4, filed on Oct. 22, 2018. The entire disclosure of these applications are incorporated by reference herein.

Field

The disclosure relates to an optical system, in particular for microlithography. The disclosure also relates to an optical pulse stretcher having at least one beam splitter and can be used, for example, in a laser light source for use in a microlithographic projection exposure apparatus.

Background

Microlithography is used to produce microstructured electronic components. The microlithography process can be carried out in what is known as a projection exposure apparatus, which includes an illumination device and a projection lens. The image of a mask (=reticle) illuminated via the illumination device can be case projected via the projection lens onto a substrate (e.g. a silicon wafer) that is coated with a light-sensitive layer (photoresist) and arranged in the image plane of the projection lens in order to transfer the mask structure to the light-sensitive coating of the substrate.

In a projection exposure apparatus designed for operation in the DUV range (e.g. at operating wavelengths of less than 250 nm, in particular less than 200 nm), optical components made of cubic crystalline material such as calcium fluoride ($CaF_2$) are often used, for instance, to avoid compaction effects, especially in the area of high radiation exposure. This can also apply in particular to components within the laser light source used to generate the electromagnetic radiation, wherein argon fluoride excimer lasers can be used at an operating wavelength of 193 nm and krypton fluoride excimer lasers can be used at an operating wavelength of 248 nm.

The abovementioned optical components exposed to high levels of radiation can be, for example, beam splitters, which can be used in an optical pulse stretcher for coupling out some of the electromagnetic radiation within the laser light source. In such an optical pulse stretcher, the relevant radiation is typically deflected via circulation paths with the aim of decomposing pulses (e.g. of 20 ns pulse length) generated by the laser light source into a plurality of temporally staggered partial pulses and of thus stretching the pulse over a longer period of time of, for example, (100-150) ns to correspondingly reduce otherwise occurring high power peaks to avoid degradation of subsequent optical components.

During the operation of such laser light sources or optical pulse stretchers, an undesirable disturbance of the polarization properties of the electromagnetic radiation can occur, which can be observed especially when generating laser radiation with a comparatively high light output. Although the known effect of what is known as intrinsic birefringence (IB) that occurs in cubic crystalline material is still generally comparatively weak at the operating wavelength of 193 nm mentioned, thermally induced mechanical stresses can occur when generating high light outputs as a result of local heating within the respective optical components or beam splitters, which can then lead to stress birefringence (SB). Likewise, permanent disruptions of the translational symmetry due to structural changes in the material caused by degradation can be the cause of permanent birefringence. A retardation (this denotes the difference between the optical paths of two orthogonal polarization states) associated with this birefringence can cause a disturbance of the polarization properties and influence a for example specifically set polarized illumination setting in an undesirable manner.

Ultimately, the consequence can be an undesirable deviation of the electromagnetic radiation coupled into the projection exposure apparatus from the desired polarization state (which is desired, for example, for achieving a maximum imaging contrast) and thus an impairment of the performance of the projection exposure apparatus.

Reference is made merely by way of example to DE 20 2004 020 810 U1, EP 2 036 170 B1 and U.S. 7,564,888 B2.

SUMMARY

The present disclosure seeks to provide an optical system, for example, for microlithography, having at least one beam splitter, which enables the polarization properties of electromagnetic radiation to be retained as much as possible while avoiding the problems described above, even when the beam splitter is exposed to high levels of radiation.

In an aspect, the disclosure provides an optical system, in particular for microlithography, which includes:
a beam splitter, which has at least one light entry surface;
wherein the beam splitter is arranged in the optical system
  in such a way that the angles of incidence with respect to
  the surface normal which occur at the light entry surface
  during operation of the optical system lie in the range of
  45°±5°; and
wherein the beam splitter is produced in the [110] crystal
  cut.

According to some embodiments, the beam splitter is arranged in the optical system in such a way that the (001) crystal direction lies in a common plane with a beam that is incident on the beam splitter and the associated beam that is reflected at the beam splitter.

The disclosure involves the concept of ensuring in a beam splitter, which is used within an optical pulse stretcher and is typically operated at an angle of 45° with respect to the incident electromagnetic radiation within a laser light source, such as for example an argon fluoride excimer laser, by using a suitable crystal cut and a rotational orientation that is suitable with respect to the relative installation position, that the undesirable effect of thermally induced or degradation-related stress birefringence and a resulting retardation and associated disturbance of the polarization properties is as relatively weak.

The disclosure involves the consideration, which will be illustrated below, that, during the operation of a beam splitter, a specific relative installation location or a specific crystal cut may prove to be favorable in terms of minimizing stress birefringence for a beam entering the beam splitter directly through the light entry surface, but the same relative installation location or the same crystal cut can be particularly unfavorable for a beam that, after a circulation that is characteristic of an optical pulse stretcher within the pulse stretcher, enters the beam splitter at a then modified angle with respect to the respective crystal directions.

Proceeding from this consideration, the configuration or arrangement of a beam splitter with respect to its crystal cut and its (rotational) orientation in the optical system is carried out so that a reduction of stress birefringence caused by the occurrence of material tension and of the associated disturbances of the polarization properties of the electromagnetic radiation passing through the optical system is achieved not only for the beam entering the beam splitter directly, but also for a beam that is initially reflected at the beam splitter and enters the beam splitter only after it has circulated in the optical system, so that overall undesired disturbances of the polarization properties are minimized.

For example, due to the use according to the disclosure of a beam splitter produced in the [110] crystal cut and a suitable (rotational) orientation, the beam propagation in the material of the beam splitter both in the case of the directly entering beam and in the case of the beam entering only after it has circulated in the optical system is—as will be illustrated below—tilted only slightly with respect to a (111) crystal direction or a crystal direction (e.g. 11-1) that is equally favorable with respect to the minimization of stress birefringence.

The result both for the beam passing (directly) through the beam splitter and for the beam that enters the beam splitter only after circulating within the optical pulse stretcher is that a mechanical stress occurring in the material of the beam splitter brings about stress birefringence to a relatively small extent, so that undesired disturbance of the polarization properties is reduced.

The configuration according to the disclosure can have a crystal cut and orientation definition which is robust against a variation of the rotational orientation by 180° or a reversal of the entry and exit surfaces, with the result that, in terms of manufacturing technology, marking of the corresponding blanks can be achieved merely with respect to the relative axis location of a crystal axis of the (001) type (for example, by a line marking at the edge of the respective blank), and not with respect to the corresponding axis directions.

According to some embodiments, the beam splitter is arranged in the optical system in such a way that a beam entering the beam splitter through the light entry surface passes through the beam splitter at an angle of less than 10° with respect to the (111) crystal direction.

According to some embodiments, the beam splitter is arranged in the optical system in such a way that, during operation of the optical system, a beam reflected at the beam splitter enters the beam splitter after it has circulated in the optical system.

According to some embodiments, the beam entering the beam splitter after circulating in the optical system passes through the beam splitter at an angle of less than 10° with respect to the (11-1) crystal direction.

According to some embodiments, the beam splitter has a plane-parallel geometry.

According to some embodiments, the beam splitter is made from a cubic crystalline material.

According to some embodiments, the beam splitter is made from a material selected from the group including magnesium fluoride ($MgF_2$), lithium fluoride (LiF), aluminum fluoride ($AlF_3$), calcium fluoride ($CaF_2$) and barium fluoride ($BaF_2$).

According to some embodiments, the optical system is designed for an operating wavelength of less than 200 nm.

The disclosure further relates to an optical pulse stretcher for use in an optical system having the features described above, and to a laser light source, in particular for a microlithographic projection exposure apparatus, having at least one such optical pulse stretcher.

Further configurations of the disclosure can be gathered from the description and the dependent claims.

BRIEF DESCRIPTION OF THE DRAWINGS

The disclosure is explained in greater detail below on the basis of an exemplary embodiment that is illustrated in the accompanying figures, in which.

DETAILED DESCRIPTION OF PREFERRED EMBODIMENTS

An embodiment of a beam splitter used in an optical system according to the disclosure will be explained below with reference to the schematic illustrations of FIGS. 1-4.

This is based on the beam splitter being used in an optical pulse stretcher of a laser light source, such as for example an argon fluoride excimer laser. In the optical pulse stretcher, a part of the electromagnetic radiation is deflected via circulation paths with the aim of decomposing pulses (e.g. of 20 ns pulse length) generated by the laser light source into a plurality of temporally staggered partial pulses and of thus stretching the pulse over a longer period of time of, for example, (100-150) ns to avoid degradation of subsequent optical components.

Figure 4:
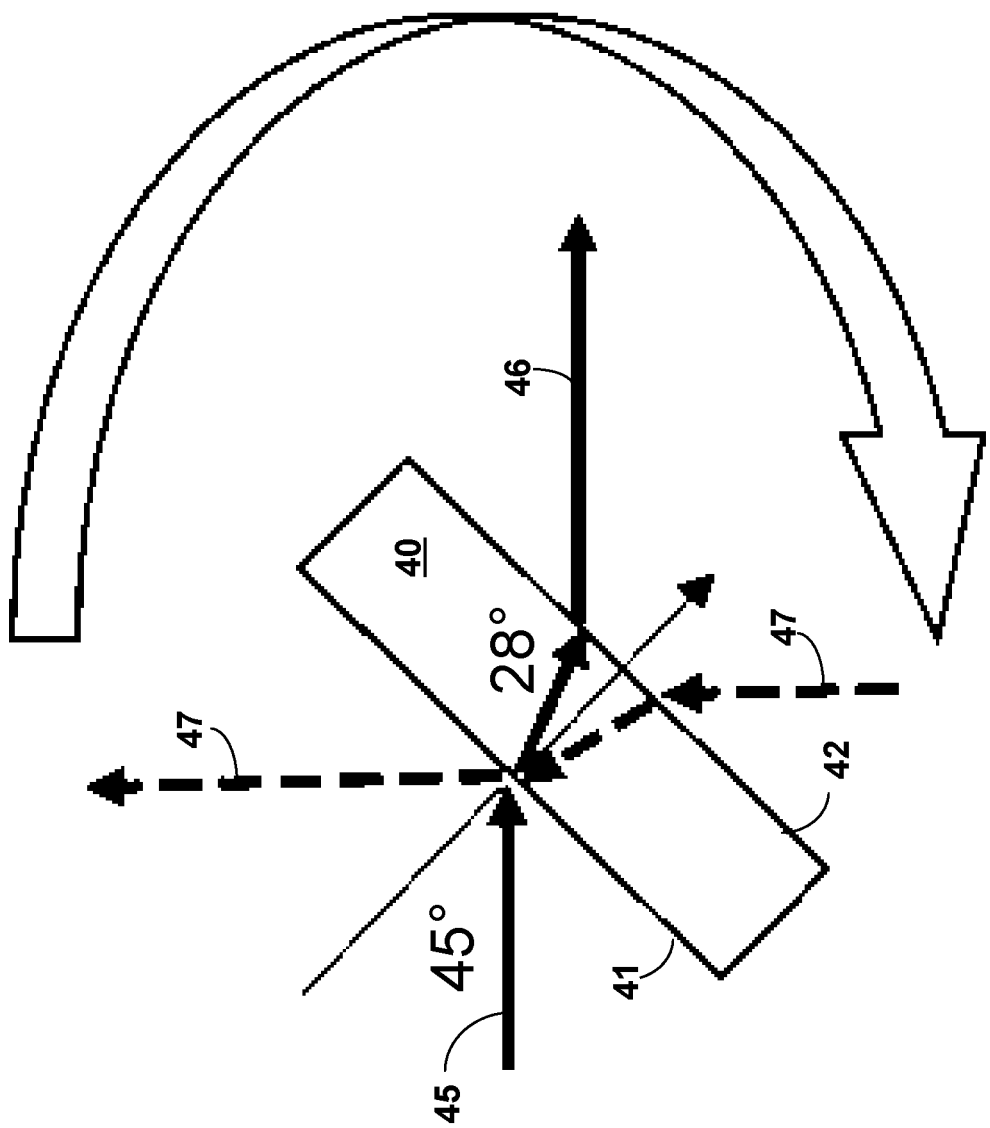
FIG. 4 shows a schematic illustration to explain a problem occurring during the operation of a conventional beam splitter.

To explain and illustrate the problem on which the disclosure is based, FIG. 4 shows a schematic illustration of a beam splitter 40 in the form of a plane-parallel plate made of calcium fluoride ($CaF_2$). The crystal cut is usually not chosen arbitrarily, but rather in an orientation that is favorable with respect to a possible manifestation of stress birefringence. The definition of the crystalline orientation can relate to both the crystal cut and the rotational orientation of the plate. The beam splitter 40 is in the typical relative installation position at an angle of 45° with respect to the incident beam 45, wherein the beam path both for a beam 46 passing through the beam splitter 40 via a light entry surface 41 and for a beam 47 that is reflected at the light entry surface 41 and initially circulates within the optical pulse stretcher is shown. As indicated in FIG. 4, the circulating beam 47 finally enters via a further surface 42 of the beam splitter 40.

If (e.g. thermally induced) mechanical stress is present in the crystal material, a beam path along the (111) crystal direction has the result, in a manner known per se, that stress birefringence occurs to the smallest extent possible.

Based on this consideration, the present disclosure now includes the concept of ensuring that, for both the beam passing through (directly) and the beam entering after circulation in the optical pulse stretcher, a beam passage through the beam splitter takes place near a crystal direction that is favorable in view of minimizing stress birefringence, by using a beam splitter in the [110] crystal cut that is operated at an angle of 45° with respect to the incident electromagnetic radiation in particular within an optical pulse stretcher of a laser light source.

Figure 1:
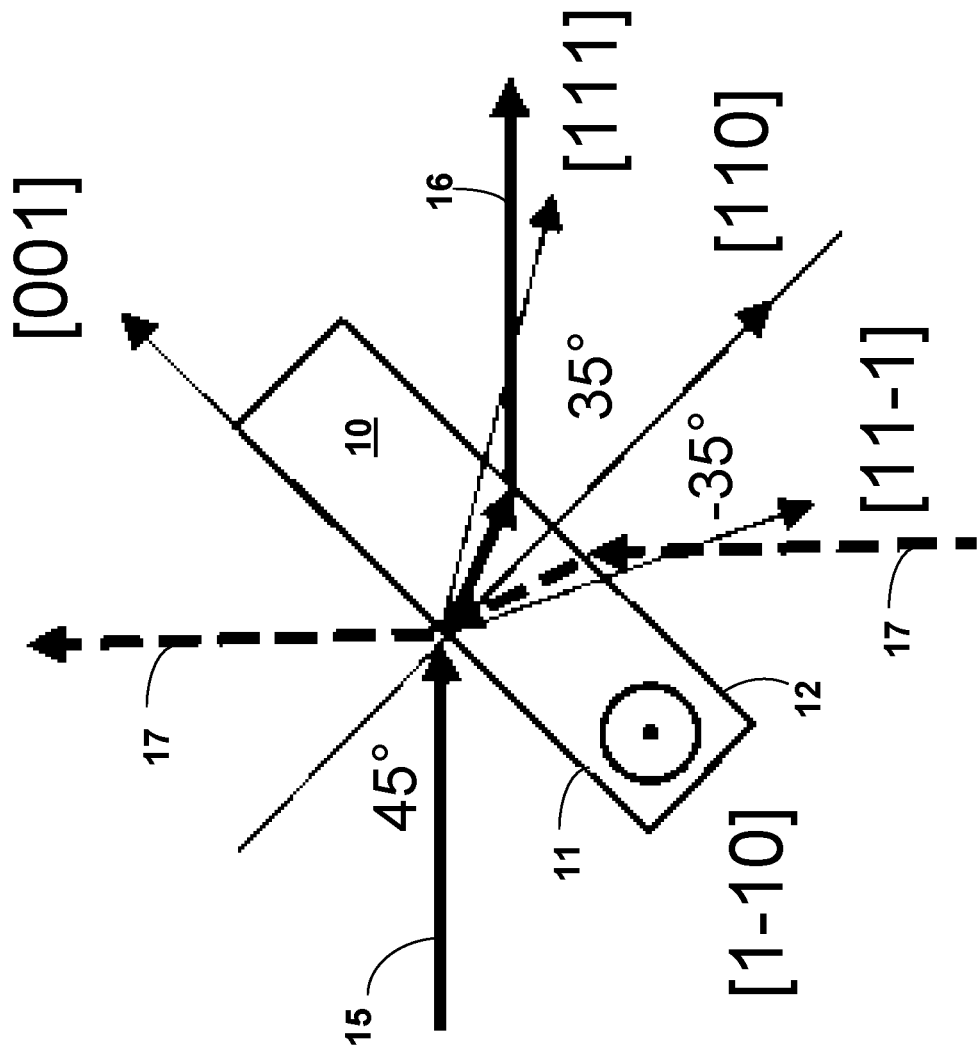
FIGS. 1-3 show schematic illustrations for explaining an embodiment of a beam splitter that is used in an optical system according to the disclosure.

Such a configuration according to the disclosure is illustrated in FIG. 1, wherein a beam splitter 10 of plane-parallel geometry, which is produced from calcium fluoride ($CaF_2$), for example, is arranged at an angle of 45° with respect to electromagnetic radiation incident on a light entry surface 11 of the beam splitter 10.

FIG. 1 shows both the schematic beam path for a beam 16 passing through the beam splitter 10 via the light entry surface 11 and for a beam 17 that is initially reflected at the light entry surface 11 and thus initially circulates within the optical pulse stretcher before finally entering the beam splitter 10 via a further surface 12. The beam splitter 10 according to FIG. 1 is produced in the [110] crystal cut and furthermore, as is likewise evident from FIG. 1, is arranged with respect to its rotational orientation in such a way that the (001) crystal direction lies in a common plane with the beam 15 that is incident on the beam splitter 10 and the circulating beam 17 reflected at the beam splitter.

Figure 2:
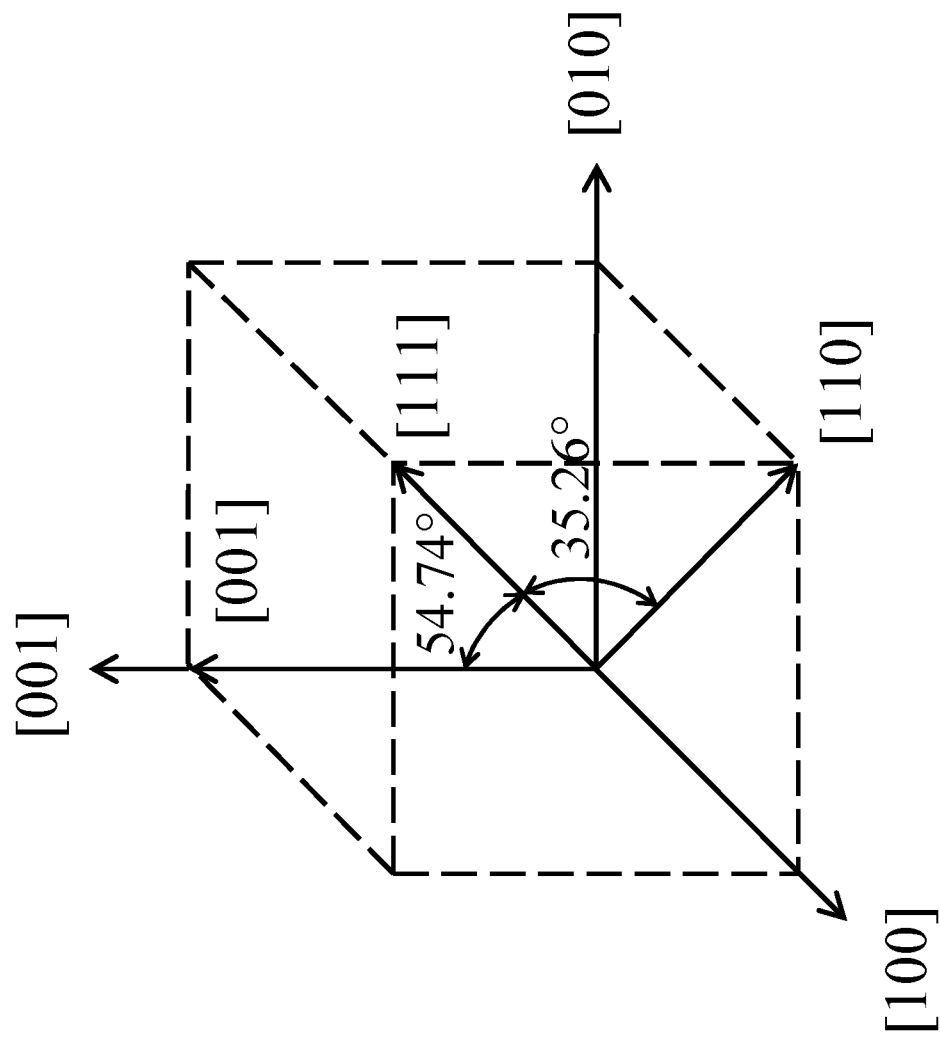

This rotational orientation of the beam splitter 10 implies, according to FIG. 2, that the crystalline (111) and (11-1) directions also lie in the plane of the beam propagation and each have an angle of 35° with respect to the (110) direction.

This configuration according to the disclosure now has the consequence that the beam 16 passing through lies near the (111) crystal direction, which is favorable with respect to the desired minimization of stress birefringence. Furthermore, the configuration according to the disclosure also has the consequence that a configuration favorable with respect to minimizing stress birefringence, to be specific a beam path near the (11-1) crystal direction, is also achieved for the circulating beam 17.

The result both for the beam passing (directly) through the beam splitter 10 and for the beam that enters the beam splitter 10 only after circulating within the optical pulse stretcher is that a thermally induced mechanical stress occurring in the material of the beam splitter 10 brings about stress birefringence to as small an extent as possible, so that undesired disturbance of the polarization properties is minimized.

Figure 3:
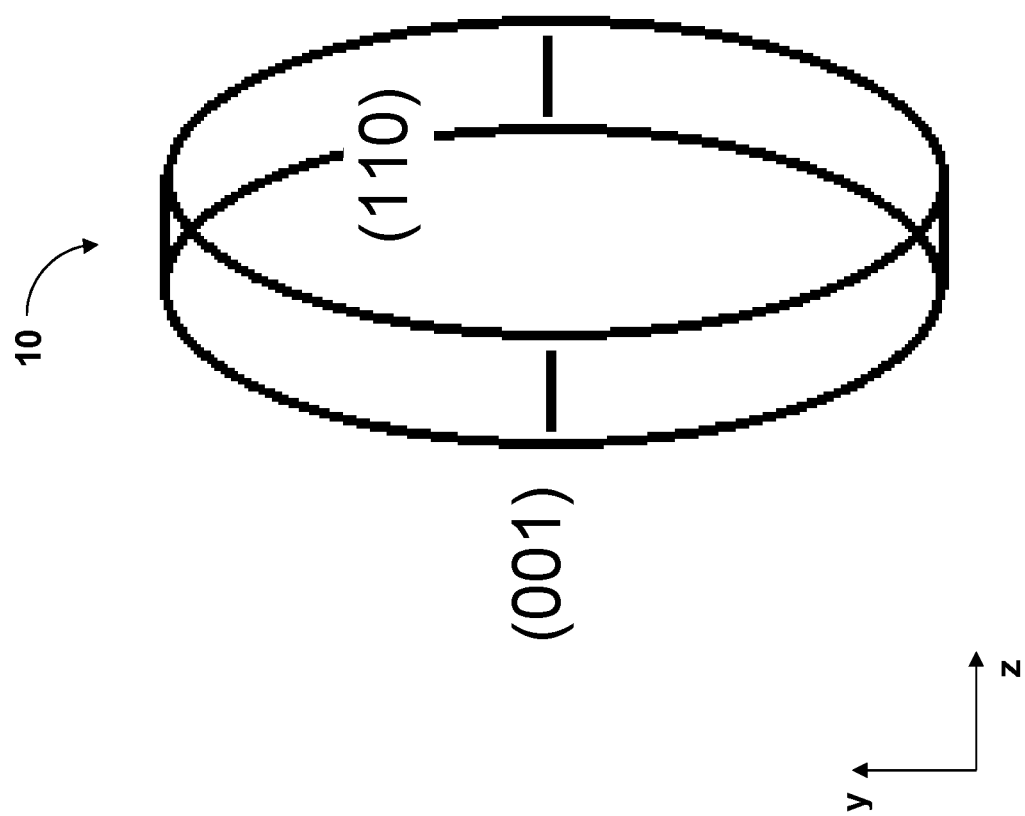

Since the definition of the crystal cut and the orientation according to the disclosure is robust against a variation of the rotational orientation by 180° or a reversal of the entry and exit surfaces, identification of the corresponding blanks can be achieved, as indicated in FIG. 3, merely with respect to the relative axis location of a crystal axis of the (001) type (e.g. by a line marking at the edge of the respective blank), and not with respect to the corresponding axis directions.

Even though the disclosure has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are encompassed by the present disclosure, and the scope of the disclosure is only restricted as provided by the appended patent claims and the equivalents thereof.

What is claimed is:

1. An optical system, comprising:
   a beam splitter comprising a light entry surface having a surface normal, wherein:
   the beam splitter is arranged in the optical system so that, during use of the optical system, angles of incidence with respect to the surface normal lie in a range of 45°±5°; and
   the beam splitter is produced in the [110] crystal cut.

2. The optical system of claim 1, wherein the beam splitter is configured so that, during use of the optical system, the (001) crystal direction lies in a common plane with a beam that is incident on the beam splitter and an associated beam that is reflected at the beam splitter.

3. The optical system of claim 1, wherein the beam splitter is configured so that, during use of the optical system, a beam entering the beam splitter through the light entry surface passes through the beam splitter at an angle of less than 10° with respect to the (111) crystal direction.

4. The optical system of claim 1, wherein the beam splitter is configured so that, during use of the optical system, a beam reflected at the beam splitter enters the beam splitter after circulating in the optical system.

5. The optical system of claim 4, wherein the beam splitter is configured so that, during use of the optical system, the beam that enters the beam splitter after circulating in the optical system passes through the beam splitter at an angle of less than 10° with respect to the (11-1) crystal direction.

6. The optical system of claim 1, wherein the beam splitter has a plane-parallel geometry.

7. The optical system of claim 1, wherein the beam splitter comprises a cubic crystalline material.

8. The optical system of claim 1, wherein the beam splitter comprises a material selected from the group including calcium fluoride ($CaF_2$), magnesium fluoride ($MgF_2$), lithium fluoride (LiF), aluminum fluoride ($AlF_3$) and barium fluoride ($BaF_2$).

9. The optical system of claim 1, further comprising an optical pulse stretcher, wherein the optical pulse stretch comprises the beam splitter and a plurality of mirrors.

10. The optical system of claim 1, wherein the optical system is a microlithography laser light source.

11. The optical system of claim 1, wherein the optical system is configured to use at an operating wavelength of less than 200 nm.

12. The optical system of claim 1, wherein the beam splitter is configured so that, during use of the optical system:
   the (001) crystal direction lies in a common plane with a beam that is incident on the beam splitter and an associated beam that is reflected at the beam splitter; and
   a beam entering the beam splitter through the light entry surface passes through the beam splitter at an angle of less than 10° with respect to the (111) crystal direction.

13. The optical system of claim 12, wherein the beam splitter is configured so that, during use of the optical system, a beam reflected at the beam splitter enters the beam splitter after circulating in the optical system.

14. The optical system of claim 12, wherein the beam splitter has a plane-parallel geometry.

15. The optical system of claim 1, wherein the beam splitter is configured so that, during use of the optical system:
   the (001) crystal direction lies in a common plane with a beam that is incident on the beam splitter and an associated beam that is reflected at the beam splitter; and
   a beam reflected at the beam splitter enters the beam splitter after circulating in the optical system.

16. The optical system of claim 15, wherein the beam splitter has a plane-parallel geometry.

17. The optical system of claim 1, wherein the beam splitter is configured so that, during use of the optical system:
   a beam entering the beam splitter through the light entry surface passes through the beam splitter at an angle of less than 10° with respect to the (111) crystal direction; and a beam reflected at the beam splitter enters the beam splitter after circulating in the optical system.

18. The optical system of claim 17, wherein the beam splitter has a plane-parallel geometry.

19. An optical pulse stretcher, comprising:
a plurality of mirrors; and
a beam splitter comprising a light entry surface having a surface normal, wherein:
the beam splitter is arranged in the optical pulse stretcher so that, during use of the optical pulse stretcher, angles of incidence with respect to the surface normal lie in a range of 45°±5°; and
the beam splitter is produced in the [110] crystal cut.

20. A laser light source, comprising:
an optical pulse stretcher, comprising:
a plurality of mirrors; and
a beam splitter comprising a light entry surface having a surface normal, wherein:
the beam splitter is arranged in the optical pulse stretcher so that, during use of the optical laser light source, angles of incidence with respect to the surface normal lie in a range of 45°±5°; and
the beam splitter is produced in the [110] crystal cut.

* * * * *

UNITED STATES PATENT AND TRADEMARK OFFICE
CERTIFICATE OF CORRECTION

| | | |
|---|---|---|
| PATENT NO. | : 11,906,753 B2 | Page 1 of 1 |
| APPLICATION NO. | : 17/229167 | |
| DATED | : February 20, 2024 | |
| INVENTOR(S) | : Johannes Kraus | |

It is certified that error appears in the above-identified patent and that said Letters Patent is hereby corrected as shown below:

On the Title Page

Item (57), Column 2, Line 7, delete "[110] the" insert -- the [110] --.

Signed and Sealed this
Ninth Day of April, 2024

Katherine Kelly Vidal
*Director of the United States Patent and Trademark Office*